(12) United States Patent
Gokay et al.

(10) Patent No.: US 7,529,286 B2
(45) Date of Patent: May 5, 2009

(54) SCALABLE THERMALLY EFFICIENT PUMP DIODE SYSTEMS

(75) Inventors: Cem Gokay, Centerville, OH (US); William Williams, Melbourne, FL (US)

(73) Assignee: D-Diode LLC, Dayton, OH (US)

( * ) Notice: Subject to any disclaimer, the term of this patent is extended or adjusted under 35 U.S.C. 154(b) by 468 days.

(21) Appl. No.: 11/299,029

(22) Filed: Dec. 9, 2005

(65) Prior Publication Data

US 2007/0133644 A1 Jun. 14, 2007

(51) Int. Cl.
H01S 3/09 (2006.01)
(52) U.S. Cl. .......................................... 372/69; 372/70
(58) Field of Classification Search .................. 372/69, 372/70
See application file for complete search history.

(56) References Cited

U.S. PATENT DOCUMENTS 4,306,278 A * 12/1981 Fulton et al. ................ 362/259
4,653,056 A    3/1987 Baer et al.
5,778,020 A    7/1998 Gokay
6,101,208 A    8/2000 Gokay
6,295,307 B1   9/2001 Hoden et al.

OTHER PUBLICATIONS

Young, Lee W., Authorized officer, International Searching Authority, Written Opinion of the International Searching Authority, International Patent Application Serial No. PCT/US06/47448, completion date: Oct. 30, 2008.
Young, Lee W., Authorized officer, International Searching Authority, International Search Report, International Patent Application Serial No. PCT/US06/47448, search date: Nov. 1, 2008.

* cited by examiner

*Primary Examiner*—Dung T Nguyen
(74) *Attorney, Agent, or Firm*—Kolisch Hartwell, P.C.

(57) ABSTRACT

Scalable, thermally efficient pump diode systems. These systems may include an arrangement of pump diodes and thermally conductive spacers mounted within a single indentation in a substrate or substrate clamps, so as to provide enhanced heat removal from the system. These systems also may include a plurality of such pump diode assemblies mounted, in a symmetric or partially symmetric arrangement, around a lasing medium in a diode pumped laser system, to improve heat removal and/or excitation of the medium.

20 Claims, 7 Drawing Sheets

SCALABLE THERMALLY EFFICIENT PUMP DIODE SYSTEMS

INTRODUCTION

Lasers are devices that use a quantum mechanical effect, stimulated emission, to generate light. This light may be produced in continuous or pulsed modes and typically is intense, coherent, monochromatic, and directional. Lasers create light using a lasing medium capable of population inversion, a condition in which the rate of optical amplification—i.e., spontaneous photon emission followed by stimulated emission—exceeds the rate at which photons are absorbed by the medium. To attain population inversion, the atoms of the lasing medium generally must be excited by an external energy source. Excitation of a lasing medium typically begins with pumping by an external optical source, which may be tuned to excite one or more particular atomic transitions in the medium. In other words, the pump may be designed to output most or all of its light to match the absorption spectrum of the lasing medium, since any energy emitted by the pump and not absorbed by atoms within the medium is wasted. The absorption spectrum of the lasing medium may be discrete, requiring a particular wavelength to excite atoms from the ground state to a desired excited state, or it may be continuous, allowing absorption of a range of wavelengths to produce the desired excitation. A number of different types of optical pumps have been developed with these different possibilities in mind.

Flash lamps and arc lamps having emission spectra that peak at appropriate wavelengths may be used for pumping a laser. Such lamps may be constructed from sealed tubes containing noble gases such as krypton or xenon, and may have dimensions and/or shapes designed to match the dimensions of the lasing medium. These lamps generally have emission spectra that include several sharp peaks, one or more of which is chosen to coincide with the absorption spectrum of the lasing medium. However, other emission peaks typically will lie outside this absorption spectrum, which can lead to significant energy losses.

Incandescent lamps such as tungsten filament bulbs also may be used for pumping a laser. Such lamps generally emit a blackbody spectrum of radiation, which is a continuous spectrum that peaks at a particular wavelength depending on the temperature of the filament. Such a continuous spectrum may lead to substantial energy losses due to large amounts of radiation falling outside the absorption band of the laser. Although these losses can be minimized by carefully choosing the temperature of the filament such that the bulb's emission spectrum peaks near the center of the lasing medium's absorption band, and are further mitigated by the relatively low cost of the incandescent pump, they may be significant in many applications.

Laser diodes that produce radiation at approximately or precisely the desired excitation wavelength also may be used for pumping a laser. In other words, a first laser system, or pumping laser system, may be used to pump the lasing medium of a second laser system, or pumped laser system. Due to the effect of optical amplification described above, the pumped laser may have much greater peak intensity than the pumping laser.

Pump diodes may be positioned parallel to the long axis of elongate lasing media, so as to transmit radiation in a direction perpendicular to propagation of the laser light ultimately produced. This arrangement is sometimes called side pumping. Unfortunately, side pumping of a laser by one or more diode pumps may result in various undesirable effects, including inefficiency due to loss of diode energy, creation of isolated regions of excitement ("hot spots") within the lasing medium, overheating of the diode pumps, uneven mechanical stress on the laser, and/or undesirably large temperature gradients between the diodes and the adjacent mounting surface, among others. These effects may be especially pronounced when a plurality of diodes are used simultaneously as pumps. To counter these effects, a number of systems have been developed that use various symmetric arrangements of diode pumps in an attempt to limit energy losses and hot spots. Various systems also have been developed to avoid overheating of the diode pumps by conducting heat away from them with a cooling medium, such as water or forced air. Examples of such systems are disclosed, for example, in U.S. Pat. Nos. 5,778,020 and 6,101,208, which are incorporated herein by reference. Some prior art systems have focused on using a using a single piece of beryllium oxide with multiple distinct grooves for the inlay of diode bars. However, such systems still may suffer from thermal problems, such as overheating, at high-power outputs.

Unfortunately, despite the corrective attempts described above, problems of inefficiency, hot spots, large temperature gradients, and overheating still exist in diode pumped laser systems, especially systems that require high power. Thus, a need still exists for an improved diode pumped laser system, and components thereof, having increased thermal and packaging efficiency, more homogeneous excitation of a lasing medium, better-controlled temperature gradients, and/or more rapid conduction of heat away from the diode pumps. Improved thermal efficiency is especially lacking in the prior art. Inefficiency of removing heat from the diode bars results in limited power, reduced reliability, and increased system cost, weight, size, and power.

SUMMARY

The present disclosure provides scalable, thermally efficient pump diode systems. These systems may include an arrangement of pump diodes and thermally conductive spacers mounted within a single indentation in a substrate or substrate clamps, so as to provide enhanced heat removal from the system. These systems also may include a plurality of such pump diode assemblies mounted, in a symmetric or partially symmetric arrangement, around a lasing medium in a diode pumped laser system, to improve heat removal and/or excitation of the medium.

DETAILED DESCRIPTION

The present disclosure provides scalable, thermally efficient pump diode systems, including components, assemblies, and uses thereof. The diode systems may include (1) diode mounts, (2) pump diode assemblies, (3) pump head assemblies, and/or (4) diode pumped laser systems, among others. The diode systems may be used to excite a lasing medium in a diode pumped laser system, among other applications. The mounts and assemblies may relate to or include an alternating arrangement of pump diodes (or diode bars) and thermally conductive spacers, mounted within a single indentation in a substrate or substrate clamps. The pump diodes and conductive spacers may be in contact with one another, without intervening substrate. A plurality of such pump diode assemblies may be mounted, in a symmetric or partially symmetric arrangement, around a lasing medium to improve heat removal and/or to provide more efficient excitation of the medium. Such arrangements may increase power output from the laser by enhancing heat removal and/or excitation of the lasing medium. Moreover, such arrangements may increase the uniformity in temperature experienced by the pump diodes, and so lead to a more monochromatic light output, which in turn can lead to more efficient pumping and/or to more monochromatic output by the associated laser system. The components of these various systems may be scalable, i.e., usable with different numbers, sizes, and/or shapes of diodes and/or spacers in the diode assemblies, diode assemblies in the pump head assemblies, and so on. These and other aspects of the present disclosure are described below, in more detail, including but not limited to (I) an overview of the system, including (A) pump diodes, (B) thermally conductive spacers, and (C) substrates, and (II) examples of various pump diode assemblies, pump head assemblies, and diode pumped laser systems, among others.

I. Overview

Figure 1:
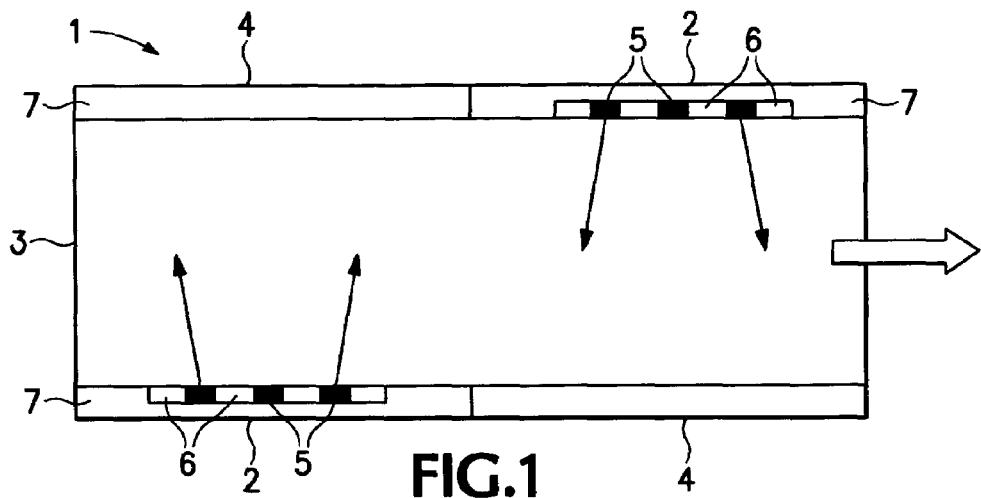
FIG. 1 is a schematic diagram showing a pump head assembly for a diode pumped laser system, according to aspects of the present disclosure.

FIG. 1 is a schematic diagram showing an exemplary diode pumped laser system 1, and components thereof, according to aspects of the present disclosure. The laser system may include (1) one or more pump diode assemblies 2, capable of generating light (shown by the thin vertical arrows), (2) a lasing medium 3, capable of excitation by the light created by the diode assemblies, and capable of generating laser light (shown by the thick horizontal arrow), and (3) one or more reflective interfaces 4, capable of reflecting light generating by the diode assemblies back into the lasing medium. The diode assemblies, in turn, may include (1) a plurality of pump diodes (or diode bars) 5, (2) a plurality of thermally conductive spacers 6, disposed between and separating the pump diodes, and/or (3) a substrate 7 for receiving the pump diodes and conductive spacers, as described above. The combination of pump diode assemblies, in turn, optionally in combination with other features, may be termed a pump head assembly. These and other aspects of the present disclosure are described below, in more detail.

I.A. Diode Bars

Diode bars (or pump diodes), as used herein, include light-emitting diodes capable of producing light. This light may be have a single wavelength, or a range of wavelengths, and may be directed in a narrow beam, or over a broader range of angles. Diode bars may be selected that emit a desired wavelength within the absorption range of the lasing medium used in an associated diode pumped laser system. For example, diode bars may be selected that emit radiation having wavelengths falling within a range of about 600-1550 nanometers (nm), to excite an atomic transition from the ground state to a suitable excited state in a lasing medium, such as a four-level, or greater than four-level, lasing medium. In the specific case of a lasing medium constructed from yttrium aluminum garnet doped with neodymium ions (known as Nd:YAG), diode bars may be selected that emit radiation having one or more wavelengths falling within the range from 700-900 nm, or specifically that emit radiation at or around 808 nm, corresponding to one or more prominent absorption bands of Nd:YAG. More generally, the diode bars may be selected to emit one or more wavelengths most appropriately matched to the absorption spectrum of any chosen lasing medium. The diode bars may include a single laser diode, or a plurality of laser diodes, for example, in any suitable arrangement (such as a one-dimensional array).

II.B. Spacers

Spacers (or thermally conductive spacers), as used herein, include spacing members that may be disposed between and separate the diode bars. These spacers may be constructed from any suitable material(s), such as a high thermal conductivity material, to conduct heat away from the diode bars and/or the lasing medium. Exemplary materials may include gold, copper, copper tungsten alloy, and/or diamond, among others. The choice of spacer material(s) may depend, for example, on factors such as the cost of the material, the number of diode bars, the power output of the diode bars, and/or the power output of the laser system, among others. The number of conductive spacers used may depend on some or all of these same factors. Typically, there will be one more spacer than diode bar, so that spacers may be disposed between each successive diode bar, and also between the outermost diode bars and the substrate.

The spacers may be coated, in some embodiments, with suitable material(s), such as metallic solder (or other deposition), to provide an electrically conductive path between the diode bars and the spacers. This may be particularly appropriate, for example, in embodiments in which the spacer material is a good thermal conductor, but a relatively poor electrical conductor. For instance, many forms of diamond have extremely high thermal conductivity, making diamond a good spacer material choice with regard to its ability to conduct heat away from the lasing medium and/or diode bars. However, diamond typically also is a relatively poor electrical conductor, so that the use of bare diamond spacers may make it difficult to supply electrical current to the diode bars by applying a voltage across the bar/spacer array. Coating the diamond spacers with an electrically conducting material such as metallic solder provides one possible solution to this difficulty. Other solutions may include supplying power to each diode bar independently and/or creating a conducting path across the bar/spacer array in some other suitable manner, such as with a conducting liquid or with a solid conducting strip constructed from a material such as copper and/or gold.

I.C Substrates

Substrates, as used herein, include supports for the alternating arrangements of diode bars and spacers, or diode arrays, described above. Typically, the substrate will include a recess or indentation for receiving the diode bars and spacers. Alternating the diode bars and thermally conductive spacers within a single indentation, rather than merely separating the diode bars with substrate material by disposing the diodes within a plurality of notches or grooves formed in the substrate, may enhance heat removal.

The substrates may be constructed from any suitable material(s). Exemplary materials may be thermally conductive but electrically nonconductive, or nearly so, such as beryllium oxide (BeO) and/or diamond. Alternatively, exemplary materials may be both thermally and electrically conductive, or nearly so, such as metals, including copper, gold, tungsten, and/or various metal alloys. Thermally conductive materials may facilitate conducting heat away from the pump diodes and/or lasing medium. Electrically conductive materials may facilitate conducting electricity to and from the diode bars, for example, to power the diode bars.

The substrates may be constructed in any suitable manner. In some cases, the substrates may be constructed unitarily (i.e., from a single piece of substrate material). In other cases, the substrates may be constructed from two, three, or more sections of material, also known as base members or components, configured to fit together. When the substrate is constructed from two members, the members may fit together to form a single indentation within which the diodes and spacers fit. When the substrate is constructed from three members, the members may fit together to form an indentation having sides formed by two of the members, and a floor or base formed by the third member. Similarly, any number of members may be used to form an indentation configured to receive the alternating diode bars and spacers, with the indentation formed by one member alone, or any suitable subset thereof. Moreover, in some cases, the member(s) may form more than one indentation, for receiving different sets of diode bars and spacers.

I.D. Pump Diode Assemblies/Pump Head Assemblies

The diode bars, spacers, and substrates described above may be combined to form pump diode assemblies and/or pump head assemblies, among others. The pump diode assemblies may include pluralities of pump diodes and/or spacers, together with one or more substrates, and the pump head assemblies may include pluralities of pump diode assemblies. The pump diode assemblies and pump head assemblies, in turn, may be combined with suitable lasing media, such as a lasing medium slab, to form a diode pumped laser system.

The diode bars, spacers, and substrate(s) may be selected and assembled in any suitable order, for example, first forming an array of diodes and spacers, and then placing the formed array in the indentation, or placing the diodes and spacers separately or in small groups into the indentation, and simultaneously forming an array of these components in the process, among others. These steps may involve pushing against portions such as sides of the substrate that optionally provide a holding or clamping force to maintain the assembled diodes and spacers within the indentation.

The number, nature, dimensions, and arrangement of the different components used in the pump diode assemblies, pump head assemblies, and/or diode pumped laser systems may be chosen based on a variety of criteria. For example, the pump diodes and lasing medium may be selected such that the pump diodes are capable of exciting, or pumping, the lasing medium. Similarly, the spacers may be selected to be electrically conducting or nonconducting based on whether the pump diodes are powered by electricity received through the spacers or through wires, respectively.

The components of these assemblies and systems typically will have complementary sizes. For example, typical diode bars each may have a thickness or a width of between approximately 100 µm and 200 µm (0.1 mm-0.2 mm), and conductive spacers each may have a thickness or a width of between approximately 300 µm and 600 µm (0.3 mm-0.6 mm). (Here, 1 µm is $10^{-6}$ meters (a micrometer or micron), and 1 mm is $10^{-3}$ meter (a millimeter).) Thus, a typical arrangement of six diode bars and seven spacers may have a total width of between approximately 2.7 mm and 5.4 mm, plus a relatively small amount of additional width if the spacers are coated with metallic solder or the like. More specifically, in a particular embodiment, the diode bars each may have a width of approximately 140 µm (0.14 mm), the spacers each may have a width of approximately 400 µm (0.4 mm), and the solder connecting each diode bar/spacer pair may have a width of approximately 50 µm (0.05 mm), so that an arrangement of six diode bars, seven spacers, and six solder connections may have a total width of approximately 3.94 mm.

The length, or longest dimension, of the diode bars and spacers may be chosen approximately to match the length of the lasing medium in a given system, or some integer fraction thereof. For instance, this length may be approximately 8 mm-16 mm, and in a specific embodiment it may be approximately 12 mm. The thickness, or depth, of the diode bars and spacers may be chosen based on considerations including the overall dimensions of the system, the availability of suitable premanufactured diode bars, and/or the cooling efficiency of a particular choice of dimensions. For example, the depth of the diode bars may be approximately 1 mm, and the depth of the spacers may be approximately 1.5 mm. In general, the length, thickness, and depth of each spacer will be chosen at least partially based upon the size of suitable pre-manufactured diode bars. The spacers and diode bars may be placed on a high thermal conductivity insulating spacer, also referred to as a bottom spacer, or as a substrate floor or base, as described below. This base may, for example, have depth or thickness of approximately 1 mm. The bottom spacer also may have a solder coating on all surfaces, or it may be coated with solder on all surfaces except exactly under each diode bar, to avoid the possibility of electrically shorting any of the diode bars.

The pump diode assemblies may be combined in various numbers and arrangements to form pump head assemblies. These pump head assemblies may have various degrees of symmetry, such as "n-fold symmetry," where n is an integer. In general, an n-fold symmetric pump head assembly may include a plurality of pump diode assemblies, with at least one pump diode assembly oriented substantially parallel to each side of an n-sided regular polygon, or with the assemblies otherwise oriented symmetrically around a geometric solid. Examples shown below include three-fold (triangularly) symmetric pump head assemblies, four-fold (square or quasi-cylindrically) symmetric pump head assemblies, and six-fold (hexagonally) symmetric pump head assemblies, among others. Additional embodiments, not shown, can incorporate any desired degree of symmetry, or asymmetry, around a lasing medium slab of any particular geometry.

II. EXAMPLES

The following examples describe selected aspects of the present disclosure, including, among others, (1) exemplary pump diode assemblies, particularly with two-and three-component substrates, (2) exemplary pump head assemblies, particularly with three-, four-, and six-fold symmetry, and (3) exemplary diode pumped laser systems based on the exemplary pump diode and pump head assemblies. These examples and the various features and aspects thereof are included for illustration and are not intended to define or limit the entire scope of the present disclosure.

Example 1

Pump Diode Assembly with Two-Component Substrate

This example describes an exemplary pump diode assembly 10 having a "two-component substrate," according to aspects of the present disclosure.

Figure 2A:
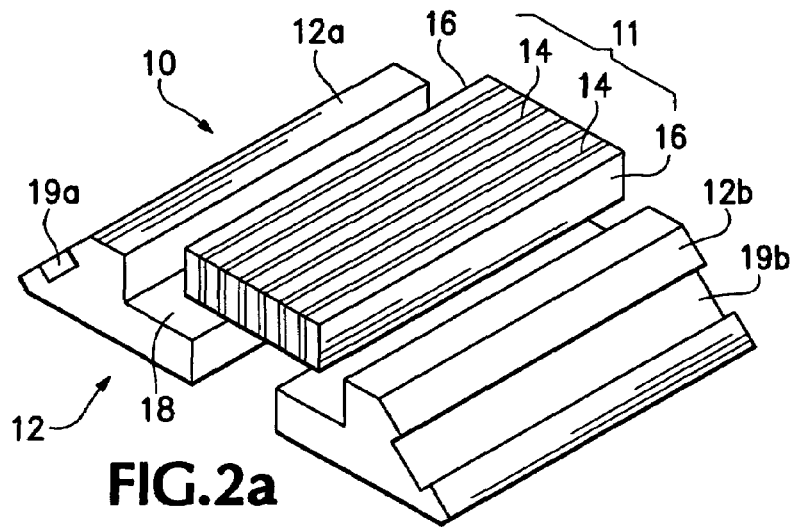
FIGS. 2a and 2b are partially exploded and fully assembled isometric views, respectively, of an exemplary pump diode assembly having a two-component substrate, according to aspects of the present disclosure.
Figure 2B:
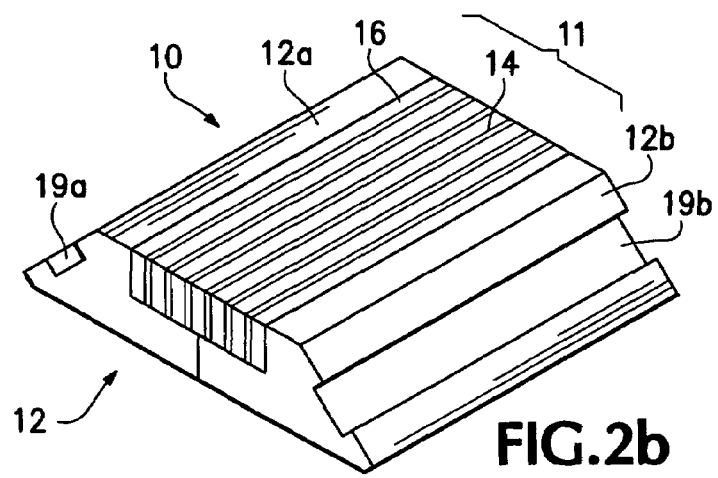

FIGS. 2a and 2b show diode assembly 10 in partially exploded and fully assembled states, respectively. The diode assembly includes a diode array 11 and a two-component substrate 12.

Diode array 11 includes a plurality of interspersed diode bars 14 and thermally conductive spacers 16. These components are disposed in an at least substantially parallel and alternating pattern, such that each diode bar is adjacent at least one spacer, and such that the diode bars and spacers collectively form a substantially planar right parallelepiped. Moreover, there typically will be one more spacer than diode bar, such that each diode bar is surrounded on both sides by a spacer, and such that the component at each end of the array is a spacer. In other embodiments, there may be one fewer spacers than diode bars, such that the component at each end of the array (and in contact with the substrate) is a diode bar.

Substrate 12 supports diode array 11 and optionally may be used to connect the diode array to a suitable laser (directly, or via an intermediate connector). The substrate preferably is electrically nonconductive, or nearly so, and thermally conductive, so as to conduct heat beneficially away from portions of the laser system prone to overheating. The substrate includes two symmetric components or base members 12a and 12b configured to fit together, as shown. In other embodiments, the substrate may be formed of a single (unitary) component, asymmetric components, or three or more components, in each case configured to fit together with one another and/or one or more diode bars in any suitable manner.

The substrate preferably is electrically nonconductive and thermally conductive. The substrate may be constructed partially or completely from any suitable, thermally conductive material, for example, diamond, beryllium oxide, aluminum oxide, aluminum nitride, and/or the like.

The substrate may define an indentation 18 having sides and a floor that supports and partially surrounds diode array 11. Here, the indentation is formed collectively and equally by two base members (12a and 12b) configured to fit together. In other embodiments, the indentation may be formed unitarily within a unitary substrate, unitarily within one component of a multi-component substrate, unequally by two components, and/or equally or unequally by some or all of the components in a three or more component substrate. The indentation may apply a clamping force to the diode array so as to hold portions of the diode array together, in thermal contact with one another, and/or to hold the diode array within the indentation.

The substrate also may include other structures, such as substrate clamps, channels, and/or indentations 19a and 19b, for any suitable purpose(s). These other structures may facilitate supplying power to the diode bars, for example, by providing space for receiving wires, such as power supply bus wires. Alternatively, or in addition, these other structures may facilitate cooling the diode bars, for example, by forming channels for conducting. coolant (although some embodiments, such as the pictured embodiment, are air cooled).

Diode bars 14 and spacers 16 typically are disposed within indentation 18 in a substantially parallel and alternating pattern, as mentioned above. Thus, the shapes and dimensions of the diode array, including the diode bars and spacers, and the indentation are interrelated. Indentation 18 may be at least substantially planar, for example, an at least substantially rectangular notch, as depicted in FIGS. 2a and 2b. When the indentation is substantially planar, the diode bars and the spacers may be elongate and flat on at least one side, to fit within the planar indentation. When the indentation further is a substantially rectangular notch, as depicted in FIGS. 2a and 2b, the diode bars and the spacers further may be substantially rectangular and sized to fit within the notch.

Example 2

Pump Diode Assembly with Three-Component Substrate, Embodiment 1

This example describes an exemplary pump diode assembly 30 having a "three-component substrate," according to aspects of the present disclosure.

Figure 3A:
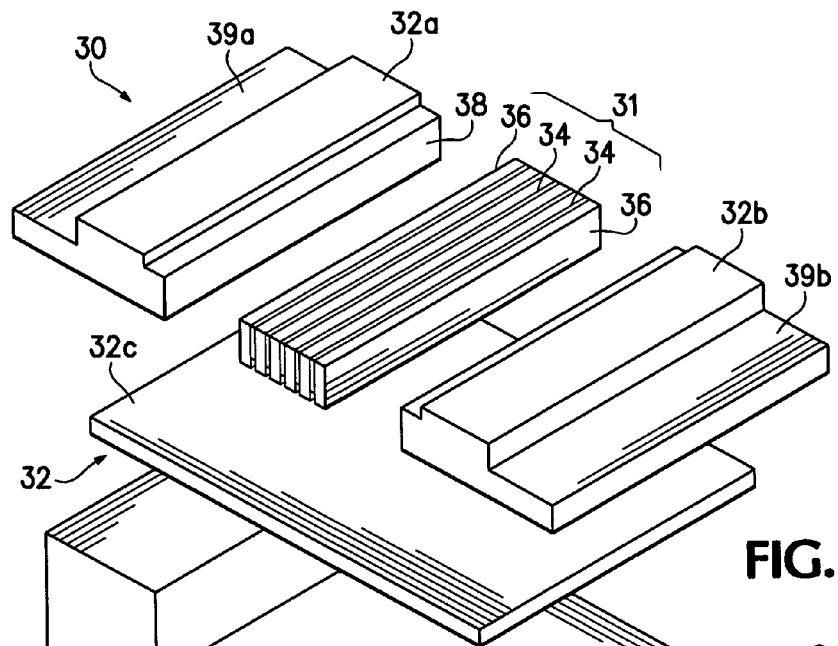
FIGS. 3a and 3b are partially exploded and fully assembled isometric views, respectively, of an exemplary pump diode assembly having a three-component substrate, according to aspects of the present disclosure.
Figure 3B:
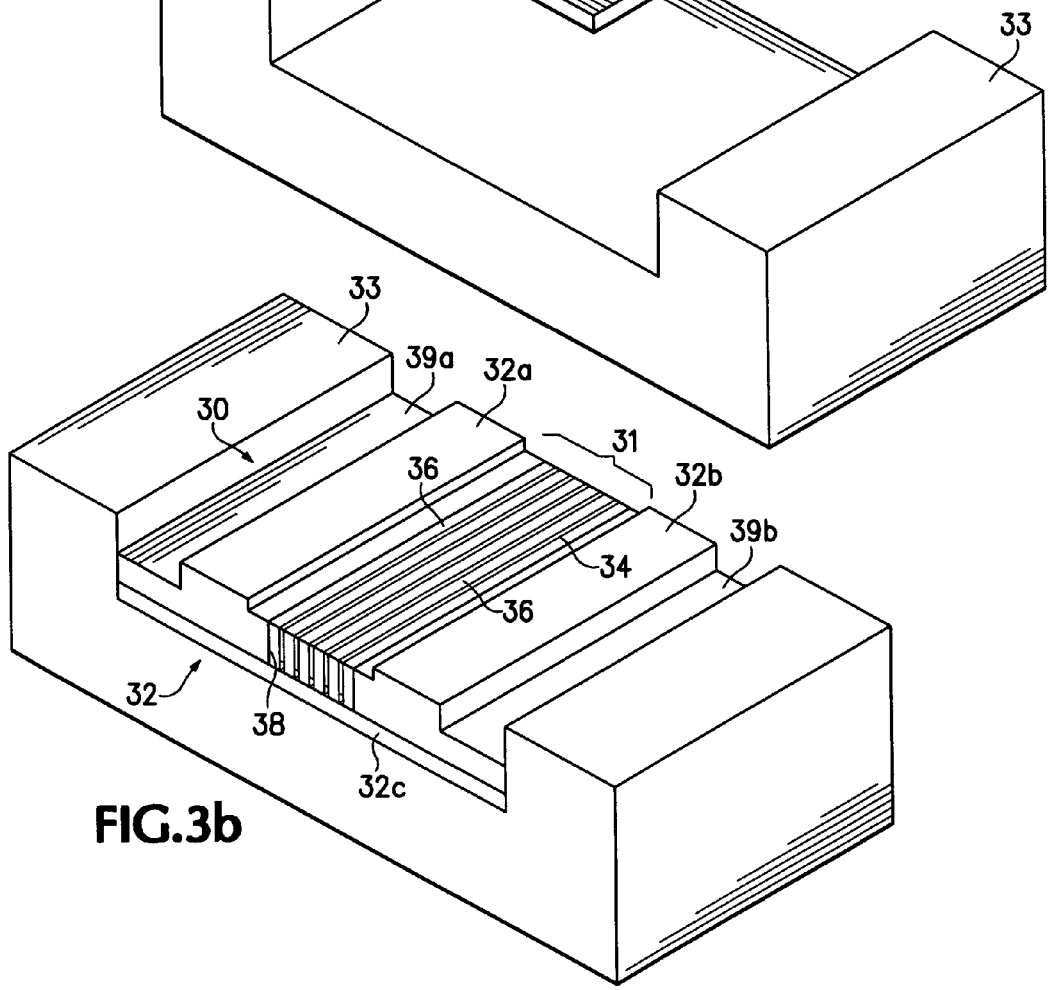

FIGS. 3a and 3b show diode assembly 30 in partially exploded and fully assembled states, respectively. The diode assembly includes a diode array 31, a three-component substrate 32, and an optional additional support member 33 (which may be considered an additional component of the substrate).

Diode array 31 includes a plurality of interspersed diode bars 34 and thermally conductive spacers 36. The diode array, including the bars and spacers, may be at least substantially as described above, for example, in Example 1.

Substrate 32 supports diode array 31 and optionally may be used to connect the diode array to a suitable laser. The substrate includes three components or base members 32a, 32b, and 32c, configured to fit together as shown to define an indentation 38. Members 32a and 32b define sides of the indentation, and member 32c, which also may be known as a conductive spacer, defines its floor. Members 32a and 32b further may be configured to apply a clamping force to the diode bars and the spacers, so as to hold them within the indentation and/or in thermal contact with each other. The diode array may be disposed within indentation 38, for example, as described above, in Example 1, for diode array 11 and indentation 18.

The substrate also may include other structures, such as substrate clamps, channels, and/or indentations 39a and 39b, for any suitable purpose(s). These other structures may, for example, provide space for receiving power supply bus wires and/or coolant, among others. The other structures may be at least substantially as described above, for example, in Example 1.

The substrate preferably is electrically nonconductive and thermally conductive (like the substrate in Example 1). The substrate may be constructed partially or completely from any suitable, thermally conductive material, for example, diamond, beryllium oxide, aluminum oxide, aluminum nitride, and/or the like. For example, base members 32a and 32b may be constructed from beryllium oxide, and base member 32c may be constructed from diamond.

In some embodiments, an additional support member 33 also may be provided, to mechanically support the other components of diode assembly 30, and/or to facilitate heat transfer from the assembly. Support member 33 may be constructed from any suitable material(s), subject to the limitations that the material(s) be capable of supporting the assembly, and in some embodiments thermally conductive. Exemplary materials include thermally conductive metals, such as copper, and/or ceramic materials, such as beryllium oxide.

Example 3

Pump Diode Assembly with Three-Component Substrate, Embodiment 2

This example describes another exemplary pump diode assembly 30' having a "three-component substrate," according to aspects of the present disclosure.

Figure 3C:
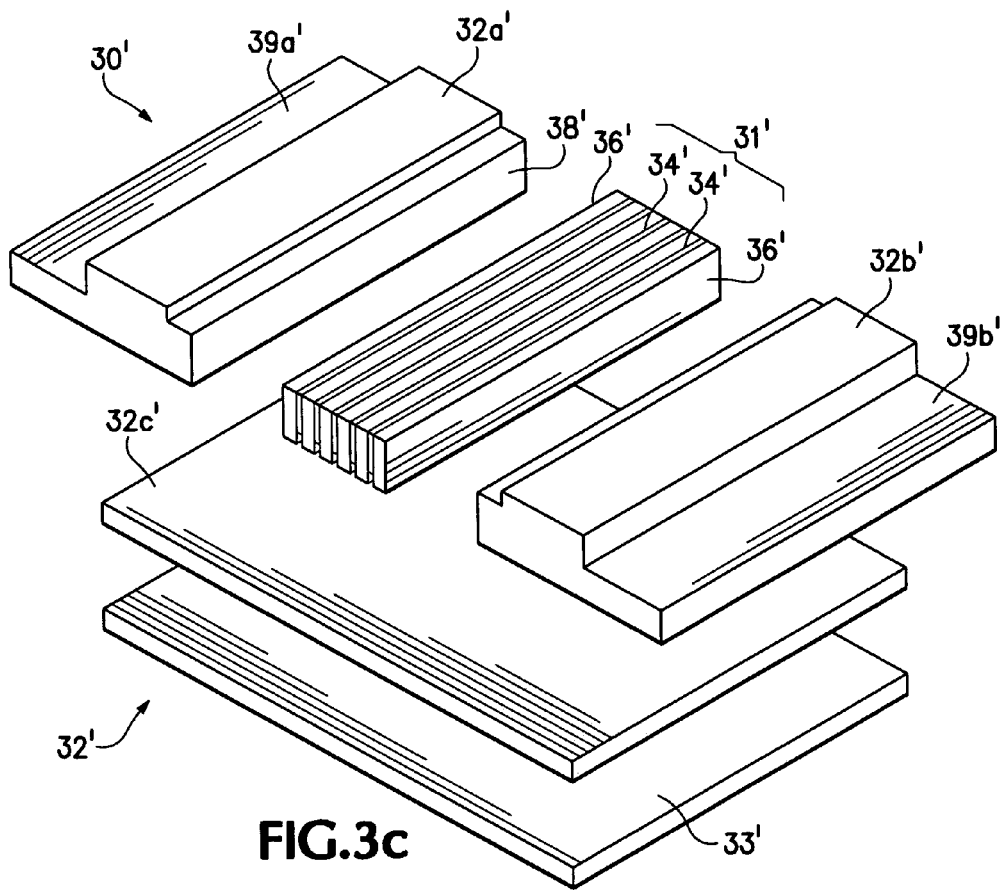
FIGS. 3c and 3d are partially exploded and fully assembled isometric views, respectively, of another exemplary pump diode assembly having a three-component substrate, according to aspects of the present disclosure.
Figure 3D:
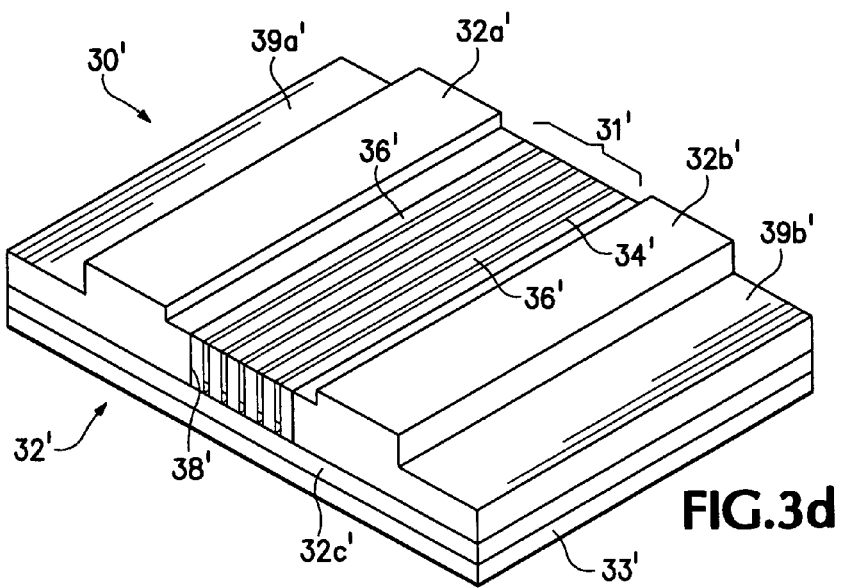

FIGS. 3c and 3d show diode assembly 30' in partially exploded and fully assembled states, respectively. The diode assembly includes a diode array 31', a three-component substrate 32', and an optional additional support member 33'. Diode assembly 30' is similar to diode assembly 30, in Example 2. In particular, the diode arrays (e.g., 31, 34, and 36, and 31', 34', and 36') and substrates (e.g., 32a-c, 38, and 39, and 32a'-c', 38', and 39') may be at least substantially identical in the two embodiments. However, the optional additional support members (e.g., 33, and 33') may differ between the two embodiments. For example, as pictured, member 33 is at least substantially U-shaped (with squared bends), whereas member 33' is at least substantially planar. Member 33' may have approximately the same length and width as base member 32c and may function to support member 32c and/or facilitate heat transfer from the diode assembly. Member 33' may be constructed from any suitable material(s), including mechanically supportive and/or thermally conductive materials, such as conductive metals (e.g., copper) and/or ceramic materials (e.g., beryllium oxide), among others.

Example 4

Pump Head Assembly

This example describes an exemplary pump head assembly 49, according to aspects of the present disclosure.

Figure 4:
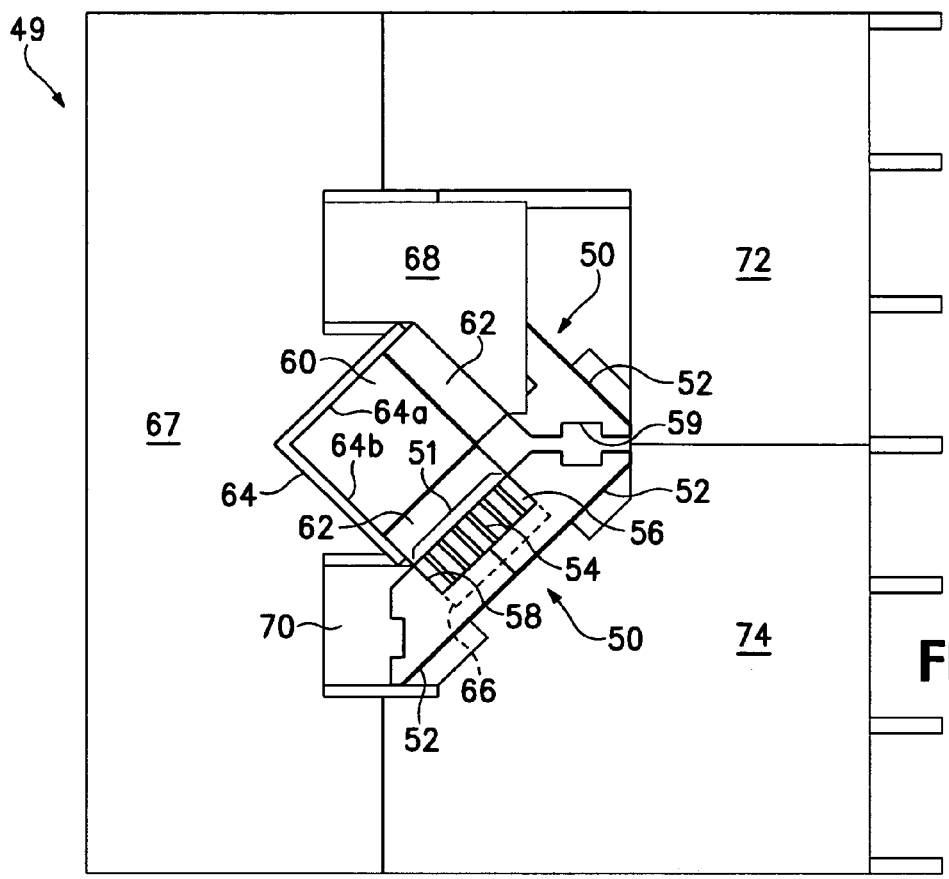
FIG. 4 is a sectional view of an exemplary pump head assembly for a diode pumped laser system, according to aspects of the present disclosure.

FIG. 4 is a sectional view of the pump head assembly 49, showing the assembly in the context of a diode pumped laser system. Pump head assembly 49 includes one or more pump diode assemblies 50. In FIG. 4, one such diode assembly is completely visible, and another such diode assembly is partially obscured (behind the visible assembly). The diode assemblies and associated components may be at least substantially similar to their counterparts presented in Examples 1-3 and shown in FIGS. 2ab, 3ab, and 3cd. The diode assemblies each include (1) a diode array 53 having a plurality of alternating diode bars 54 and conductive spacers 56, and (2) a substrate 52 defining a substantially planar indentation 58. Some embodiments further may include a supporting member, such as supporting member 33 of FIGS. 3ab and 3cd.

Alternatively, or in addition, some embodiments further may include structures 59 for receiving wires, coolant, and/or the like.

The pump head assembly may be disposed adjacent, and may partially or completely surround, a lasing medium, such as a lasing medium slab 60. The lasing medium, as previously described, may be constructed from any material(s) capable of lasing, for example, a material such as a suitable rod, slab, and/or crystal (referred to herein as, but not limited to, a "slab") capable of creating a population inversion within the slab. Exemplary lasing medium materials include yttrium aluminum garnet doped with neodymium ions (Nd:YAG), ruby (or chromium doped sapphire), neodymium doped glass, neodymium doped vanadate, and/or alexandrite, among others. Generally, any material having atoms with at least three, and preferably at least four, energy levels may be suitable, so long as one of the intermediate energy levels decays relatively slowly as compared to the other decay processes. The pump head assembly may be provided with or without a lasing medium, in the latter case (at least) being configured to be attached to or otherwise integrated with a separate lasing medium.

The system may include one or more optical heat spreaders 62, each generally disposed between the lasing medium slab and one of diode assemblies 50, and each typically also disposed at least generally adjacent both the lasing medium and the diode bars. The heat spreaders are configured to conduct heat away from the lasing medium, and to allow substantial transmission of radiation from the diode bars to the lasing medium. In some embodiments, the heat spreaders also may serve as spectral filters, reducing or removing unwanted wavelengths from the radiation entering the slab, while concomitantly reducing or removing additional unwanted heat load to the slab. The heat spreaders may be constructed of any suitable material(s), including diamond, silicon, silicon carbide, and/or sapphire, among others. Suitable materials may be chosen based on various criteria, including transparency to the wavelength(s) emitted by the diode bars, thermal conductivity, and/or cost, among others.

The system further may include one or more reflective interfaces 64. The reflective interface is shown here with two faces 64a, 64b disposed adjacent two sides of lasing medium 60. Specifically, one face 64a of interface 64 is disposed opposite diode assembly 50, which is visible in its entirety in FIG. 4, and the other face 64b of interface 64 is disposed opposite diode assembly 50, which is partially obstructed by base component 68. Interface 64 is configured to reflect diode light that passes through the lasing slab back into the slab, to provide the diode light with another opportunity to excite components of the lasing medium. Thus, interface 64 generally is constructed from a material that strongly reflects light in the appropriate absorption range of the lasing medium. For example, a thin film of indium oxide or indium nitride may have appropriate reflective properties. This interface also may be pure indium metal, which further may improve thermal conduction from lasing slab 60 to a thermally conductive base (discussed below). The use of a reflective interface can increase the efficiency of, and decrease the energy loss from, the laser system.

The system further may include one or more conductive spacers 66 (shown in dashed lines), disposed adjacent some or all of the diode arrays on the opposite side as the lasing medium. Conductive spacers 66 may be configured to conduct heat away from the diodes and lasing medium more efficiently than substrate 52 acting alone. To achieve this conduction, the conductive spacers may be constructed from a high thermal conductivity material such as diamond, a thermally conductive ceramic, and/or a thermally conductive metal, among others.

The system further may include a thermally conductive base 67. Base 67 may be formed unitarily, or it may include a plurality of separate components. These separate components may include, for example, slab holders or clamps such as base components 68 and 70, and/or pump head clamps 72 and 74, among others. Each of these base components may be constructed from any suitable heat-conducting material, typically a highly thermally conductive material(s), such as copper. Additional suitable materials include various other metals, and thermally conductive ceramics such as beryllium oxide, among others. Thermally conductive base 67 is appropriately configured for securely mounting the substrate(s), diode bars, and spacers. The base, in conjunction with the optically transmitting heat spreader(s), helps to conduct heat away from the laser medium slab to prevent overheating.

Example 5

Pump Head Assembly with Square Symmetry

Figure 5:
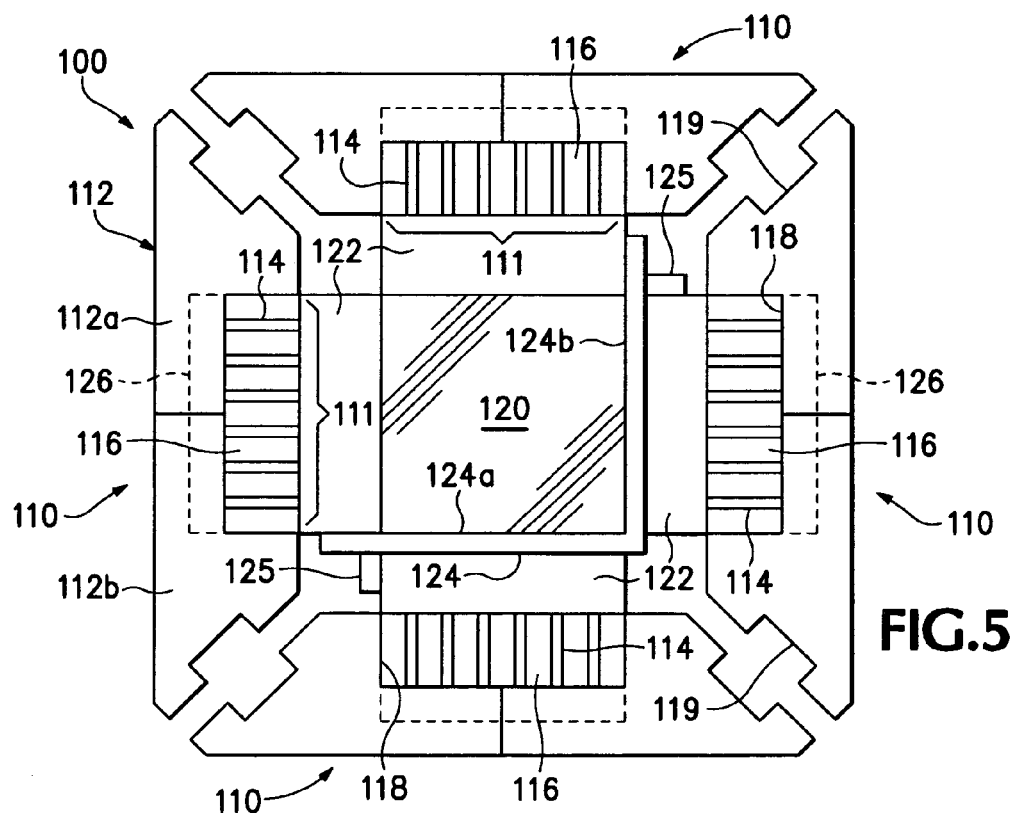
FIG. 5 is an end elevational view of portions of an exemplary diode pumped laser system, showing a four-fold (square) symmetric arrangement of pump diode assemblies disposed around a central square lasing medium slab, according to aspects of the present disclosure.
Figure 6:
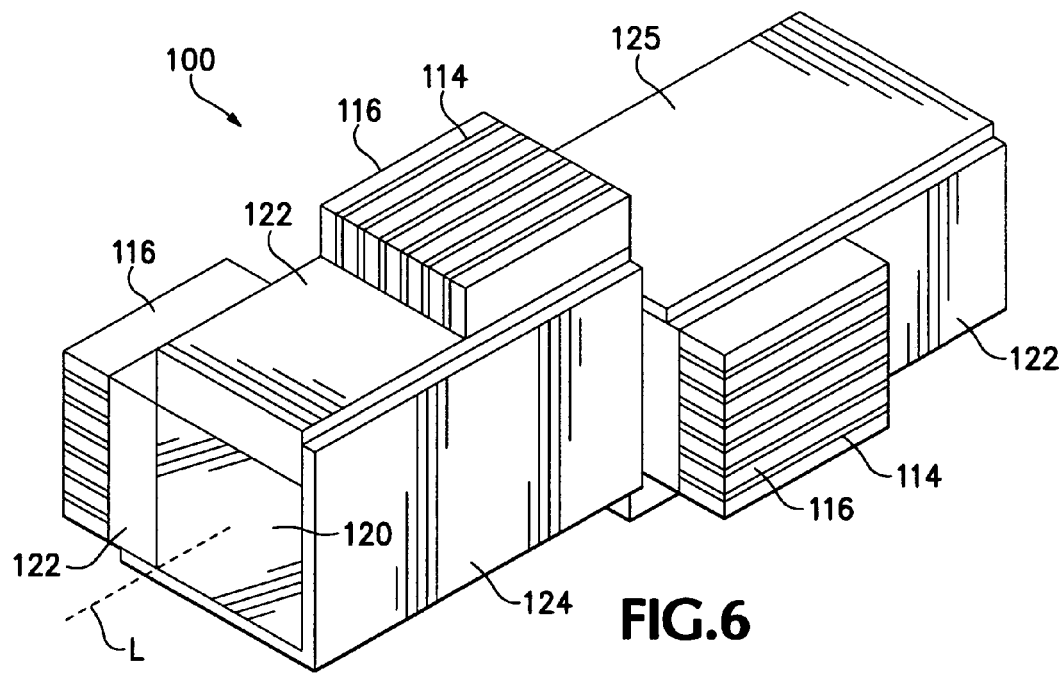
FIGS. 6 and 7 are isometric views of portions of the diode pumped laser system of FIG. 5, with the substrates removed for clarity.
Figure 7:
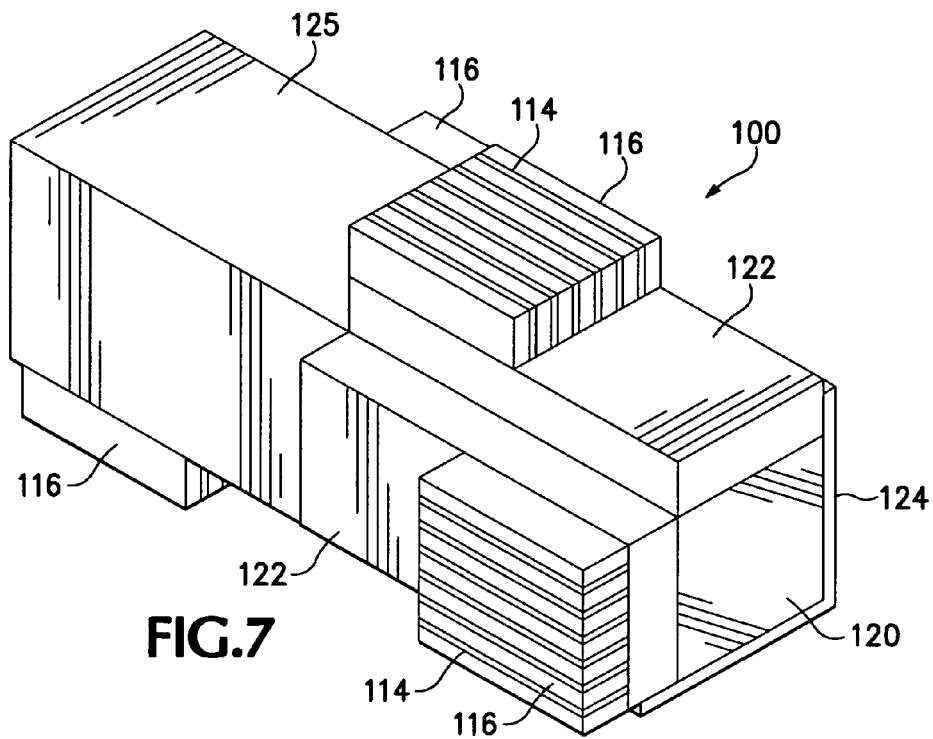

This example describes an exemplary pump head assembly 100 having four-fold, square symmetry; see FIGS. 5-7.

FIG. 5 is an end elevational view of pump head assembly 100, showing the assembly in the context of a diode pumped laser system. Pump head assembly 100 includes four pump diode assemblies 110. These diode assemblies, in turn, each include (1) a diode array 111 having a plurality of alternating diode bars 114 and conductive spacers 116, and (2) a substrate 112 having a pair of base members 112a, 112b, and defining an indentation 118 for receiving the diode array. The diode assemblies further may include structures for receiving wires, coolant, and/or the like, such as wire-receiving notches 119 running along the lengths of each pump diode assembly suitable for receiving power supply wires (not shown). The diode assemblies and associated components may be at least substantially similar to their counterparts presented in Examples 1-3 and shown in FIGS. 2 and 3. The four diode assemblies are arranged around the four sides of a square lasing medium slab 120.

The pump head assembly may include one or more optical heat spreaders 122, disposed between some or all of the diode assemblies and the lasing medium. The optical heat spreaders are configured to conduct heat away from the lasing medium, while allowing substantial transmission of radiation from the diode bars to the slab. The optical head spreaders may be at least substantially as described above, for example, in Example 4.

The pump head assembly also may include one or more reflective interfaces 124, 125, disposed opposite some or all of the diode assemblies across the lasing medium so as to reflect appropriate wavelengths back into the lasing medium slab. The reflective interfaces may increase efficiency and/or limit energy loss. Reflective interface 124 includes two faces 124a, 124b configured to reflect light emitted from the two of the four diode assemblies. Similarly, reflective interface 125, which is mostly occluded in this view, includes two faces configured to reflect light emitted from the other two diode assemblies. The reflective interfaces may be constructed from any suitable reflective material, as described previously, and may include thin films and/or thick films, among others. The reflective interfaces shown in FIG. 5 are substantially L-shaped (with equal side lengths). In other embodiments, the reflective interfaces may be constructed independently along single sides of the lasing medium, or collectively along more than two sides of the lasing medium. In still other embodiments, the reflective interfaces may be omitted entirely.

The pump head assembly also may include one or more conductive spacers 126 (shown in dashed lines), disposed adjacent some or all of the diode arrays on the opposite side as the lasing medium. The conductive spacers may be constructed from a high thermal conductivity material, such as diamond, to facilitate heat transfer away from the diodes and/or the lasing medium.

FIGS. 6 and 7 show two different isometric views of pump head assembly 100 of FIG. 5, again in the context of a diode pumped laser system. These two views, which are related by a 90-degree rotation, show the laser system with the substrates removed for clarity. The diode assemblies (110) are disposed sequentially (i.e., staggered) along a longitudinal axis L of lasing medium 120, such that each assembly is configured to excite a particular longitudinal region of the slab. These regions may be substantially nonoverlapping, as indicated in FIGS. 6 and 7. Alternatively, in other embodiments, these regions (and thus the associated diode assemblies) may be partially or completely overlapping, to excite the same portion(s) of the slab simultaneously from more than one direction. The heat spreaders (122) may extend beyond the dimensions of the associated diode assemblies. Alternatively, in other embodiments, the heat spreaders may have dimensions more closely matching the dimensions of the diode assemblies, so that each heat spreader does not extend substantially beyond the associated diode assembly.

Example 6

Pump Head Assembly with Hexagonal Symmetry

Figure 8:
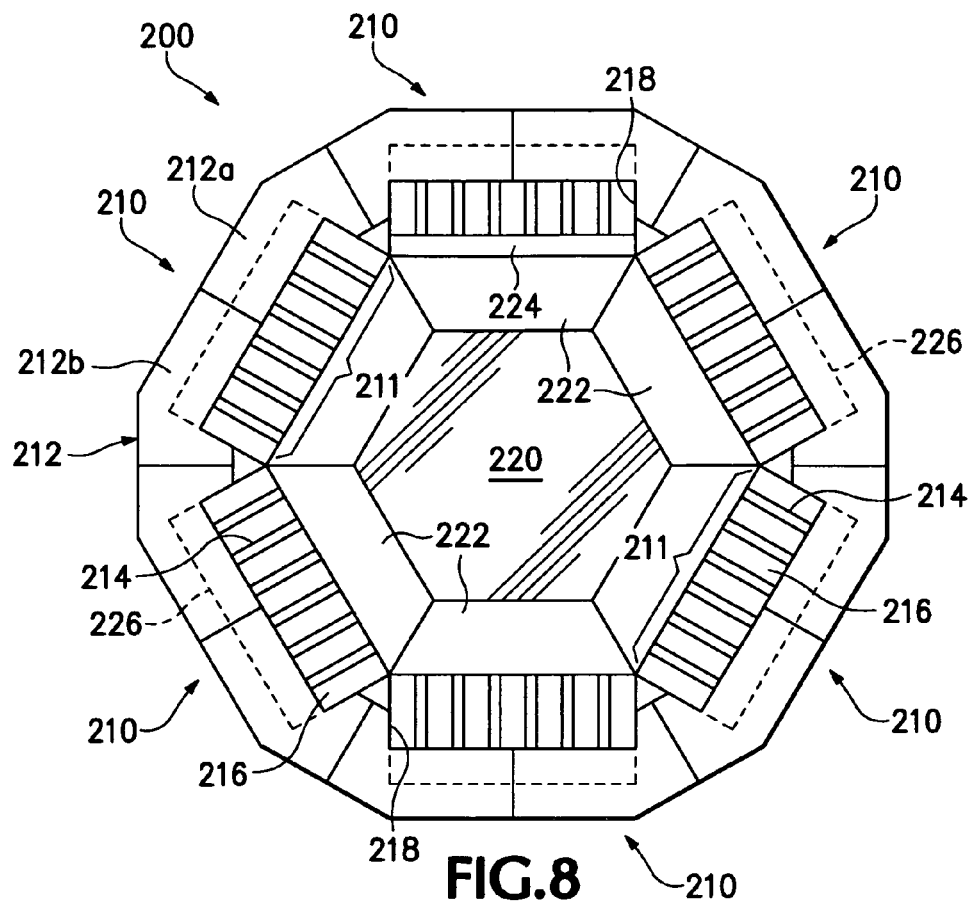
FIG. 8 is an end elevational view of portions of an alternative exemplary diode pumped laser system, showing a six-fold (hexagonal) symmetric arrangement of pump diode assemblies disposed around a central hexagonal lasing medium slab, according to aspects of the present disclosure.

This example describes an exemplary pump head assembly 200 having six-fold, hexagonal symmetry; see FIG. 8. Pump head assembly 200 includes six pump diode assemblies 210. These diode assemblies, in turn, each include (1) a diode array 211 having a plurality of alternating diode bars 214 and conductive spacers 216, and (2) a substrate 212 having a pair of base members 212a, 212b, and defining an indentation 218 for receiving the diode array. The six diode assemblies are arranged around the six sides of a hexagonal lasing medium slab 220. Pump head assembly 200 further may include (1) optical heat spreaders 222, disposed between some or all of the diode assemblies and the lasing medium, (2) reflective interfaces 224, disposed opposite some or all of the diode assemblies across the lasing medium, and/or (3) conductive spacers 226 (shown in dashed lines), disposed adjacent some or all of the diode arrays on the opposite side as the lasing medium. The pump diode assemblies, heat spreaders, reflective interfaces (if any), and/or conductive spacers (if any) may be disposed sequentially along a longitudinal axis of the lasing medium, in either an overlapping or substantially nonoverlapping manner, as described above. The remaining properties of, and interrelationships among, the components of pump head assembly 200 and the laser system may be at least substantially as described above, particularly (although not exclusively) in Example 5.

Example 7

Pump Head Assembly with Triangular Symmetry

Figure 9:
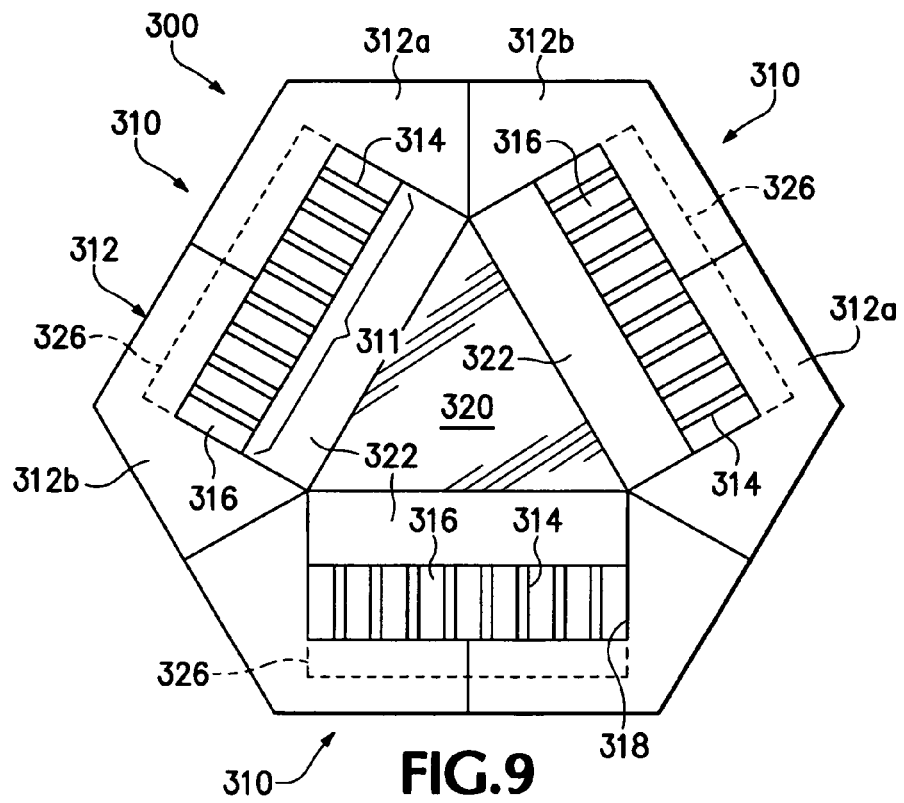
FIG. 9 is an end elevational view of portions of another alternative exemplary diode pumped laser system, showing a three-fold (triangular) symmetric arrangement of pump diode assemblies disposed around a central triangular lasing medium slab, according to aspects of the present disclosure.

This example describes an exemplary pump head assembly 300 having three-fold, triangular symmetry; see FIG. 9. Pump head assembly 300 includes three pump diode assemblies 310. These diode assemblies, in turn, each include (1) a diode array 311 having a plurality of alternating diode bars 314 and conductive spacers 316, and (2) a substrate 312 having a pair of base members 312a, 312b, and defining an indentation 318 for receiving the diode array. The three diode assemblies are arranged around the three sides of a triangular lasing medium slab 320. The pump head assembly further may include (1) optical heat spreaders 322, disposed between some or all of the diode assemblies and the lasing medium, and/or (2) conductive spacers 326 (shown in dashed lines), disposed adjacent some or all of the diode arrays on the opposite side as the lasing medium. The three-fold symmetry of this embodiment lessens the convenience of reflective interfaces, although they may be used in some embodiments. The remaining properties of, and interrelationships among, the components of pump head assembly 300 and the laser system may be at least substantially as described above, particularly (although not exclusively) in Examples 5 and 6.

Example 8

Pump Head Assembly with Quasi-Cylindrical Symmetry

Figure 10:
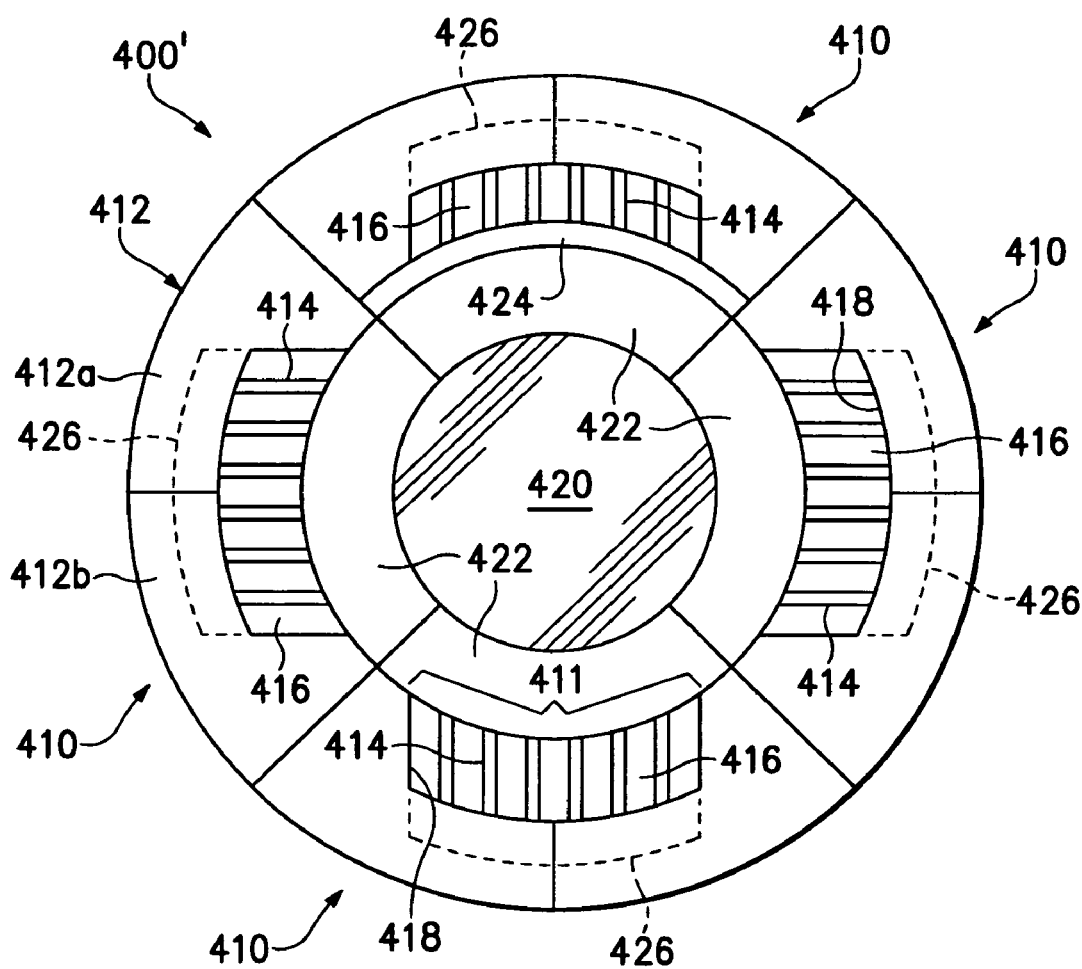
FIG. 10 is an end elevational view of portions of yet another alternative exemplary diode pumped laser system, showing a four-fold (quasi-cylindrical) symmetric arrangement of pump diode assemblies disposed around a central cylindrical lasing medium slab, according to aspects of the present disclosure.

This example describes an exemplary pump head assembly 400 having quasi-cylindrical symmetry; see FIG. 10a. Pump head assembly 400 includes four pump diode assemblies 410. These diode assemblies, in turn, each include (1) a diode array 411 having a plurality of alternating diode bars 414 and spacers 416, and (2) a substrate 412 having a pair of base members 412a, 412b, and defining an indentation 418 for receiving the diode array. The four diode assemblies are arranged, at equal or unequal intervals, around the sides of a cylindrical lasing medium slab 420. The pump head assembly further may include (1) optical heat spreaders 422, disposed between the some or all of the diode assemblies and the lasing medium, (2) reflective interfaces 424, disposed opposite some or all of the diode assemblies across the lasing medium, and/or (3) conductive spacers 426 (shown in dashed lines), disposed adjacent some or all of the diode arrays on the opposite side as the lasing medium. The diode assemblies and/or other components may be at least partially arcuate in shape to facilitate placement around the cylindrical lasing medium. The remaining properties of, and interrelationships among, the components of pump head assembly 400 and the laser system may be at least substantially as described above, particularly (although not exclusively) in Examples 5-7.

Example 9

Exemplary Applications

This example describes exemplary applications of the various systems described herein, including but not limited to the pump diode assemblies, pump head assemblies, diode pumped laser systems, and components and combinations thereof. These systems could have significant government and commercial applications, with uses in the military, law enforcement, environmental assessment, medicine, and industry, among others.

The military/law enforcement/environmental applications include transportable-pier-mounted and helicopter-mounted mass-surveillance of the domestic shallow shoreline environment. The Environmental Protection Agency (EPA) has expressed a need to monitor underwater costal deposits to catch the unseemly, criminal activities of dumping hazardous waste off the shore of the United States. The EPA as well as state and local governments have a pressing need to map the shallow deposits (with time stamps and GPS stamps) of coastal shorelines (say to four meters depth). This includes both freshwater lakes and ocean beaches and piers. Local police authorities are interested in such maps to identify dumped contraband and corpses. These maps are critical to criminal prosecution of illegal dumping and cuing law enforcement to potential evidence areas.

The military/law enforcement applications also include scanning underwater surveillance systems, underwater guidance and communication systems, and light detection and ranging (LIDAR). The blue-green portion of the spectrum is particularly suited for these applications due to the optical windows that exist in this region. Present systems, if they exist for all these applications, are cumbersome and inefficient. A high-power, highly efficient solid-state laser system capable of operating in the blue-green or other wavelength regions such as eye-safe regions opens the possibilities for incorporating these technologies into many other important military application areas. High-power laser systems also will open the potential for tunability and multi-colored operation, which would allow secure communications by selecting the wavelength that was attenuated by the medium the most, but still provide adequate message capability. The ability to frequency hop, similar to radio, also makes this an even more secure line-of-sight communication technique. With this technology, applications such as laser-based friendly or foe identification systems can become a near-future reality. The development of this solid-state laser will allow the government the opportunity to investigate these and many other applications such as laser-induced spectroscopy for remote sensing, among others.

The medical applications include use of this high-power, diode-pumped, Q-switched 1064 nm laser as a pump source to generate other wavelengths by means of solid-state crystal converters. Applications include Photo Dynamic Therapy (PDT) in the areas of dermatology, ophthalmology, and/or general surgery. All tissues have characteristic absorption spectra. If the proper part of the spectrum is selected, particular tissues can be treated, while other surrounding tissues remain unaffected. By selecting the wavelength, less power would be required for treatment with less likelihood of damage to adjacent healthy tissue. Currently, medical lasers have limited tunability or none at all, have poor efficiencies, and are large and cumbersome in design. The tunable, highly efficient solid-state design of some of the disclosed embodiments with air-cooling would partially or completely overcome the current limitations.

The industrial applications include cutting and welding. The material would have to be selected for the amount of energy required and the absorption characteristics of the material. A tunable high-power solid-state laser could be used on some of the plastic and composite materials that currently are very difficult to process, such as the boron fiber composite. Currently, there are plastic/composite materials being processed by using metal cutting lasers, but most of these lasers are much larger than necessary, inefficient, and not entirely suited for the job.

The disclosure set forth herein may encompass multiple distinct inventions with independent utility. The disclosure includes a number of section headings, which were added for convenience, and which are not intended to limit the disclosure in any way (e.g., the headings to not foreclose using information described in one section in place of, and/or in combination with, information described in other sections). Similarly, the disclosure relates information regarding specific embodiments, which are included for illustrative purposes, and which are not to be considered in a limiting sense, because numerous variations are possible. The inventive subject matter of the disclosure includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the inventions of the present disclosure.

We claim:

1. A pump diode assembly for a diode pumped laser, comprising:
   a substrate defining an indentation;
   a plurality of diode bars disposed within the indentation; and
   a plurality of thermally conductive spacers disposed within the indentation and separating the diode bars;
   wherein the substrate includes at least two base members configured to fit together to form the indentation.

2. The pump diode assembly of claim 1, wherein the indentation is a substantially rectangular notch, and wherein the diode bars and the spacers are substantially rectangular and sized to fit within the notch.

3. The pump diode assembly of claim 1, wherein the base members are configured to apply a clamping force to the diode bars and the spacers.

4. The pump diode assembly of claim 1, wherein the substrate includes two base members forming two sides of the indentation, and a third base member forming a floor of the indentation.

5. The pump diode assembly of claim 4, wherein the base members forming the two sides of the indention are constructed from a material chosen from the set consisting of beryllium oxide, aluminum oxide, and aluminum nitride, and wherein the base member forming the floor of the indentation is a thermally conductive spacer constructed from diamond.

6. The pump diode assembly of claim 1, wherein the spacers are constructed from a high thermal conductivity material chosen from the set consisting of gold, copper, copper tungsten alloy, sapphire, beryllium oxide, and diamond.

7. The pump diode assembly of claim 1, wherein the spacers are coated with metallic solder to provide an electrically conductive path between the diode bars and the spacers.

8. The pump diode assembly of claim 1, further comprising at least one optical heat spreader configured to allow substantial transmission of radiation emitted from the diode bars towards the slab.

9. A pump head assembly for a diode pumped laser, comprising:
   a substrate defining a substantially planar indentation;
   a plurality of diode bars disposed within the indentation, and a plurality of thermally conductive spacers disposed within the indentation and separating the diode bars;
   a lasing medium slab;
   at least one optical heat spreader configured to conduct heat away from the lasing medium slab and to allow transmission of radiation from the diode bars to the lasing medium slab; and
   a thermally conductive base for securely mounting the substrate, diode bars, spacers, lasing medium slab, and heat spreader.

10. The pump head assembly of claim 9, wherein the diode bars and the spacers are elongate and are disposed within the indentation in a substantially parallel and alternating pattern.

11. The pump head assembly of claim 9, wherein the indentation is a substantially rectangular notch, and wherein the diode bars and the spacers are substantially rectangular and sized to fit within the notch.

12. The pump head assembly of claim 9, wherein the substrate includes two base members configured to fit together to form the indentation, and to apply a compressive force to clamp the diode bars and the spacers fixedly together.

13. The pump head assembly of claim 9, wherein the optical heat spreader is disposed between and adjacent to the lasing medium slab and the diode bars.

14. A pump diode assembly for a diode pumped laser, comprising:
   a substrate defining an indentation;
   a plurality of diode bars disposed within the indentation; and
   a plurality of thermally conductive spacers disposed within the indentation and separating the diode bars; and
   at least one optical heat spreader configured to allow substantial transmission of radiation emitted from the diode bars towards the slab.

15. The pump diode assembly of claim 14, wherein the indentation is a substantially rectangular notch, and wherein the diode bars and the spacers are substantially rectangular and sized to fit within the notch.

16. The pump diode assembly of claim 14, wherein the substrate includes at least two base members configured to fit together to form the indentation and to apply a clamping force to the diode bars and the spacers.

17. The pump diode assembly of claim 14, wherein the substrate includes two base members forming two sides of the indentation, and a third base member forming a floor of the indentation.

18. The pump diode assembly of claim 17, wherein the base members forming the two sides of the indention are constructed from a material chosen from the set consisting of beryllium oxide, aluminum oxide, and aluminum nitride, and wherein the base member forming the floor of the indentation is a thermally conductive spacer constructed from diamond.

19. The pump diode assembly of claim 14, wherein the spacers are constructed from a high thermal conductivity material chosen from the set consisting of gold, copper, copper tungsten alloy, sapphire, beryllium oxide, and diamond.

20. The pump diode assembly of claim 14, wherein the spacers are coated with metallic solder to provide an electrically conductive path between the diode bars and the spacers.

* * * * *